(12) United States Patent
Karlovsky et al.

(10) Patent No.: US 10,573,611 B2
(45) Date of Patent: Feb. 25, 2020

(54) SOLDER METALLIZATION STACK AND METHODS OF FORMATION THEREOF

(71) Applicant: Infineon Technologies AG, Neubiberg (DE)

(72) Inventors: Kamil Karlovsky, Villach (AT); Evelyn Napetschnig, Diex (AT); Michael Ehmann, Villach (AT); Mark James Harrison, Wernberg (AT); Anton Pugatschow, Soest (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/163,006

(22) Filed: Oct. 17, 2018

(65) Prior Publication Data

US 2019/0051624 A1 Feb. 14, 2019

Related U.S. Application Data

(62) Division of application No. 14/726,078, filed on May 29, 2015, now Pat. No. 10,115,688.

(51) Int. Cl.
*H01L 23/00* (2006.01)
*H01L 21/683* (2006.01)

(52) U.S. Cl.
CPC .......... *H01L 24/05* (2013.01); *H01L 21/6835* (2013.01); *H01L 24/03* (2013.01); *H01L 24/83* (2013.01); *H01L 2221/6834* (2013.01); *H01L 2221/68327* (2013.01); *H01L 2224/0401* (2013.01); *H01L 2224/0558* (2013.01); *H01L 2224/05124* (2013.01); *H01L 2224/05166* (2013.01); *H01L 2224/05181* (2013.01); *H01L 2224/05186* (2013.01); *H01L 2224/05599* (2013.01); *H01L 2224/05684* (2013.01); *H01L 2924/014* (2013.01);
(Continued)

(58) Field of Classification Search
CPC ... H01L 27/768–76898; H01L 23/522–53295; H01L 21/3205–32155; H01L 21/823475; H01L 2221/10–1094
See application file for complete search history.

(56) References Cited

U.S. PATENT DOCUMENTS 6,472,304 B2 10/2002 Chittipeddi et al.
2007/0184578 A1 8/2007 Lin et al.
(Continued)

FOREIGN PATENT DOCUMENTS

CN 1747162 A 3/2006
CN 103515351 A 1/2014

OTHER PUBLICATIONS

Arshad, M.K. et al., "Under Bump Metallurgy (UMB)-A Technology Review for Flip Chip Packaging," International Journal of Mechanical and Materials Engineering (IJMME), No. 1, Dec. 2007, pp. 48-54.

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A semiconductor device includes a contact metal layer disposed over a semiconductor surface of a substrate, a diffusion barrier layer disposed over the contact metal layer, an inert layer disposed over the diffusion barrier layer, and a solder layer disposed over inert layer.

20 Claims, 11 Drawing Sheets

(52) U.S. Cl.
CPC .......... *H01L 2924/0105* (2013.01); *H01L 2924/01013* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/01047* (2013.01); *H01L 2924/01073* (2013.01); *H01L 2924/01074* (2013.01); *H01L 2924/04941* (2013.01); *H01L 2924/04953* (2013.01)

(56) References Cited

U.S. PATENT DOCUMENTS

| | | |
|---|---|---|
| 2008/0308917 A1 | 12/2008 | Pressel et al. |
| 2009/0134501 A1 | 5/2009 | Ganitzer et al. |
| 2010/0090318 A1 | 4/2010 | Hsu et al. |
| 2010/0090319 A1 | 4/2010 | Hsu |
| 2011/0101527 A1 | 5/2011 | Cheng et al. |
| 2012/0007244 A1 | 1/2012 | Harrison |
| 2013/0069221 A1 | 3/2013 | Lee et al. |
| 2013/0234318 A1 | 9/2013 | Lee et al. |
| 2014/0048952 A1 | 2/2014 | Lee |
| 2014/0167270 A1 | 6/2014 | Ganitzer et al. |
| 2014/0327136 A1 | 11/2014 | Tsai et al. |
| 2014/0346672 A1 | 11/2014 | Lin et al. |
| 2016/0218033 A1* | 7/2016 | Joshi .......... H01L 21/32134 |

OTHER PUBLICATIONS

Haque, S., "Processing and Characterization of Device Solder Interconnection and Module Attachment for Power Electronics Modules," Blacksburg, Virginia, Dec. 1999, 50 pages.

* cited by examiner

SOLDER METALLIZATION STACK AND METHODS OF FORMATION THEREOF

This application is a divisional U.S. application Ser. No. 14/726,078, filed on May 29, 2015, which application is hereby incorporated herein by reference.

TECHNICAL FIELD

The present invention relates generally to metal stacks, and, in particular embodiments, to solder metallization stack and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, back side contacts if needed are formed.

SUMMARY

In accordance with an embodiment of the present invention, a semiconductor device includes a contact metal layer disposed over a semiconductor surface of a substrate, a diffusion barrier layer disposed over the contact metal layer, an inert layer disposed over the diffusion barrier layer, and a solder layer disposed over inert layer.

In accordance with an alternative embodiment of the present invention, a semiconductor device includes a contact metal layer disposed over a semiconductor surface of a substrate, a diffusion barrier layer disposed over the contact metal layer, an inert layer disposed over the diffusion barrier layer, a solder active layer over the inert layer, and a capping layer over the solder active layer.

In accordance with an alternative embodiment of the present invention, a method of forming a semiconductor device includes providing a contact metal layer over a semiconductor surface of a substrate, forming a diffusion barrier layer over the contact metal layer, forming an inert layer over the diffusion barrier layer, forming a solder active layer over the inert layer, and forming a capping layer over the solder active layer.

In accordance with an alternative embodiment of the present invention, a method of forming a semiconductor device includes providing a contact metal layer over a semiconductor surface of a substrate, forming a first barrier layer contacting the contact pad layer, forming a second barrier layer over the first barrier layer, and forming a solder active layer over the second barrier layer.

In accordance with an alternative embodiment of the present invention, a method of forming a semiconductor device includes providing an aluminum layer over a semiconductor surface of a substrate, forming a titanium or chromium layer contacting the aluminum layer, forming a titanium-tungsten, titanium nitride, tantalum, tantalum nitride, or tungsten layer over the titanium or chromium layer, forming a nickel or nickel vanadium layer over the titanium-tungsten, titanium nitride, tantalum, tantalum nitride, or tungsten layer, and forming a capping layer over the nickel or nickel vanadium layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the present invention describe a solder metal stack having high corrosion resistance while having reduced stress.

To achieve acceptable electrical, mechanical as well as soldering performance, layer stack needs to be used instead of single layer. In such a stack each individual layer serves different purpose. Usually such layer stack consists of a layer providing electrical contact, a diffusion barrier layer, a solder active layer, and a capping layer. Each of the layers has different mechanical properties such as mechanical stress. By increasing the thicknesses of the layers or decreasing the thickness of semiconductor substrate material, the imposed mechanical stress and resulting wafer or chip bow can impose problems by subsequent processing, e. g., die attach. Therefore the solder stack layer thicknesses are kept as low as possible which can result in undesired reaction with the liquid solder during die attach process if the solder active layer is fully consumed during the process and liquid solder comes in direct contact with the diffusion barrier layer adjacent to the solder active layer.

Embodiments of present invention mitigate these problems by using a multiple layer barrier stack where each layer is a diffusion barrier for the overlying layer. Thus, even when a thin solder layer is used, direct contact between the titanium layer and the solder metal is avoided due to the intervening barrier layers. The inventors of the present invention have also found that the use of such a multi-layer diffusion stack provides improved performance over increasing the thickness of a single barrier layer because each layer of a multi-layer stack can be tailored to improve a specific performance. For example, each layer may be selected to prevent a specific metal from diffusing through, which is not possible by the use of a single barrier layer.

An embodiment of forming a solder metal stack will be described using FIGS. 1-4. Further embodiments of soldering the solder metal stack will be described using FIGS. 5-6. FIGS. 7-8 will be used to describe alternative structure embodiments while FIGS. 9-13 will be used to describe alternative embodiments of fabricating the device.

Figure 1:
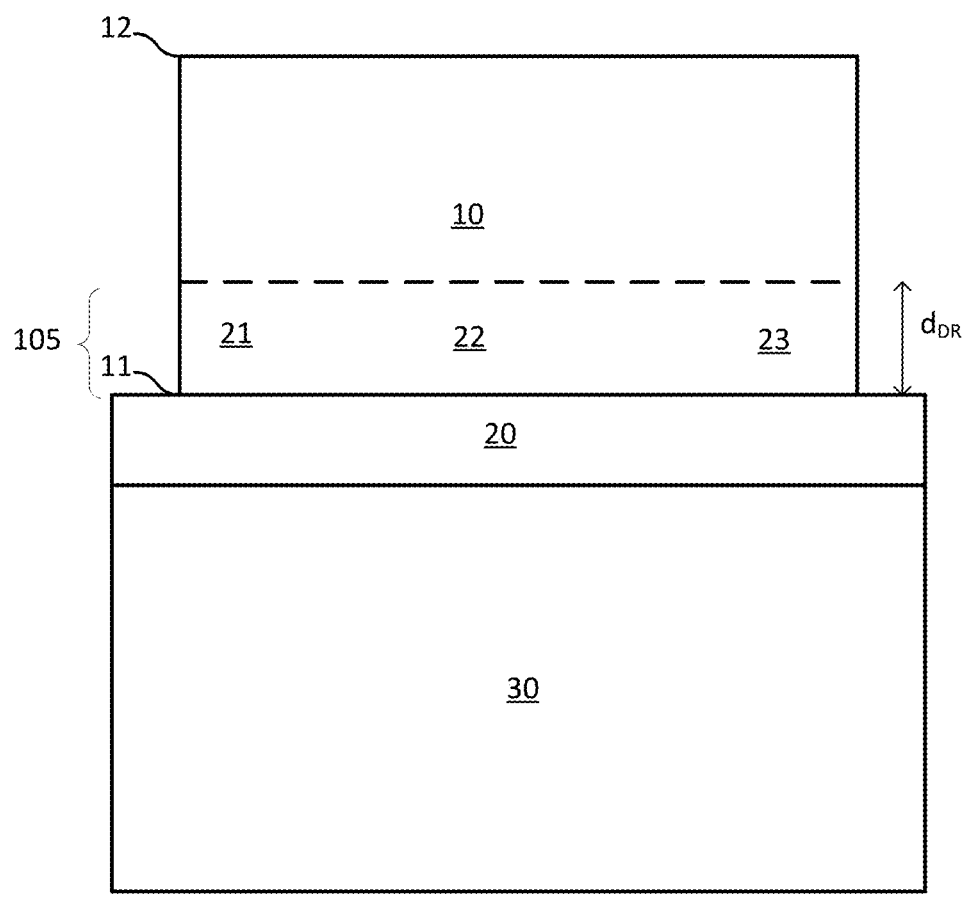
FIG. 1 illustrates a semiconductor device during fabrication in accordance with an embodiment of the present invention.

FIG. 1 illustrates a semiconductor device during fabrication in accordance with an embodiment of the present invention.

Referring to FIG. 1, a semiconductor substrate 10 after the completion of front end processing and back end processing is illustrated. The semiconductor substrate 10 has a plurality of semiconductor devices, e.g., a first chip 21, a second chip 22, and a third chip 23 formed within. Each of these chips may be any type of chip but typically the same type of chip. For example, the chip may be a logic chip, a memory chip, an analog chip, and other types of chips. Each of the first, second, and third chips 21, 22, 23 (and others on the semiconductor substrate 10) may comprise a plurality of devices such as transistors or diodes forming an integrated circuit or may be a discrete device such as a single transistor or a single diode. In one embodiment, these are power chips and are vertical devices.

In one embodiment, the semiconductor substrate 10 may comprise a semiconductor wafer such as a silicon wafer. In other embodiments, the semiconductor substrate 10 may comprise other semiconductor materials including alloys such as SiGe, SiC or compound semiconductor materials such as GaAs, InP, InAs, GaN, sapphire, silicon on insulation, for example. The semiconductor substrate 10 may include epitaxial layers in one or more embodiments.

Referring to FIG. 1, device regions 105 including the first chip 21, the second chip 22, and the third chip 23 are disposed within the semiconductor substrate 10. The device regions 105 may include doped regions in various embodiments. Further, some portion of the device regions 105 may be formed over the semiconductor substrate 10. The device regions 105 may include the active regions such as channel regions of transistors.

The semiconductor substrate 10 comprises a front side 11 and an opposite back side 12. In various embodiments, the active devices are formed closer to the front side 11 of the semiconductor substrate 10 than the back side 12. The active devices are formed in device regions 105 of the semiconductor substrate 10. Device regions 105 extends over a depth $d_{DR}$, which depending on the device, is about 5 µm to about 50 µm, and about 10 µm in one embodiment.

In various embodiments, all necessary interconnects, connections, pads etc. for coupling between devices and/or with external circuitry are formed over the front side 11 of the semiconductor substrate 10. Accordingly, a metallization layer is formed over the semiconductor substrate 10. The metallization layer may comprise one or more levels of metallization. Each level of metallization may comprise metal lines or vias embedded within an insulating layer. The metallization layer may comprise metal lines and vias to contact the device regions and also to couple different devices within the chips.

A protective layer, such as a passivation layer, may be formed over the metallization layer before further processing. The protective layer may comprise an oxide, nitride, polyimide, or other suitable materials known to one skilled in the art. The protective layer may comprise a hard mask in one embodiment, and a resist mask in another embodiment. The protective layer helps to protect the metallization layer as well as the device regions during subsequent processing.

After forming the protective layer, the front side 11 of the semiconductor substrate 10 is attached to a carrier 30 using an adhesive component 20. Further, in some embodiments, a primer coating may be applied prior to coating the adhesive component 20. The primer coating is tuned to react with the surface of the semiconductor substrate 10 and convert potentially high surface energy surfaces to lower surface energy surfaces by forming a primer layer. Thus, in this embodiment, the adhesive component 20 interacts only with the primer layer improving the bonding.

In one or more embodiments, the adhesive component 20 may comprise a substrate, e.g., polyvinyl chloride, with the coating of an adhesive layer such as an acrylic resin. The adhesive component 20 may comprise an organic compound such an epoxy based compound in alternative embodiments. In various embodiments, the adhesive component 20 comprises an acrylic based, not photoactive, organic glue, acrylamide, SU-8, which is a negative tone epoxy based photo resist, molding compound, an imide and/or components such a poly-methyl-methacrylate (PMMA) used in forming a poly-imide.

After mounting the semiconductor substrate 10 over the carrier 30 using the adhesive component 20, the semiconductor substrate 10 is subjected to a thinning process. The final depth of the chip formed in the semiconductor substrate 10 will be determined after thinning. The bottom surface of the first chip 21, the second chip 22, and the third chip 23 will be exposed after a thinning process. A thinning tool, which may be a grinding tool in one embodiment, reduces the thickness of the semiconductor substrate 10. In another embodiment, the thinning tool may use a chemical process such as wet etching or plasma etching to thin the semiconductor substrate 10. In another embodiment, the thinning tool may use a polishing process such as chemical mechanical planarization process.

Figure 2:
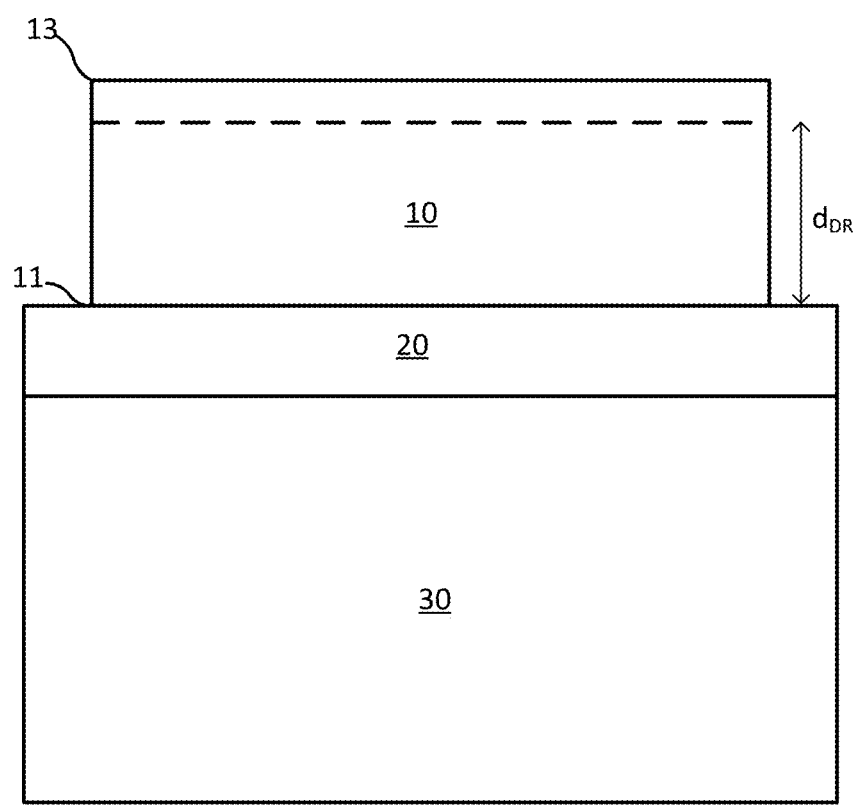
FIG. 2 illustrates a semiconductor device during fabrication after thinning the substrate mounted over a carrier in accordance with embodiments of the present invention.

FIG. 2 illustrates a semiconductor device during fabrication after thinning the substrate mounted over a carrier in accordance with embodiments of the present invention.

The thinning process exposes a new back side 13 of the semiconductor substrate 10 as illustrated in FIG. 2. As described above, the thinning process may include a mechanical grinding as well as etching and polishing processes such as chemical etching, plasma etching, and chemical mechanical polishing. An additional cleaning process may be performed to remove any native oxides formed during and/or after the thinning process.

Figure 3:
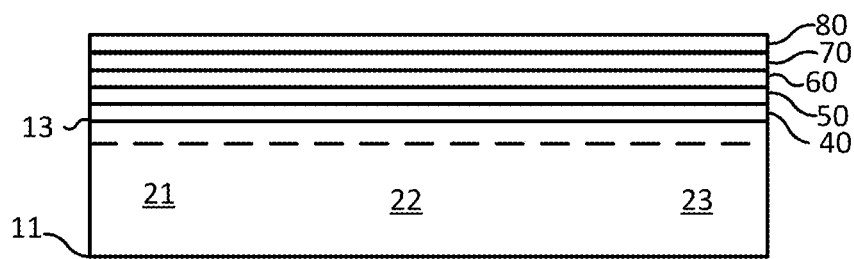
FIG. 3 illustrates a semiconductor device during fabrication after forming a contact layer over a back side of the substrate in accordance with embodiments of the present invention.

FIG. 3 illustrates a semiconductor device during fabrication after forming a contact layer over a back side of the substrate in accordance with embodiments of the present invention.

As next illustrated in FIG. 3, after removing the carrier 30, a contact metal layer 40 is deposited over the back side 13 of the substrate 10. The contact metal layer 40 may comprise more than one conductive layer in various embodiments. In some embodiments, prior to contact formation, a back side implant and anneal may be performed to form a doped region in the substrate. The doped region may be used to reduce the resistance of the contact. Additionally, prior to metal deposition, any native oxide is removed using wet chemical etching or alternatively in-situ directly using plasma etching before contact metal deposition.

In various embodiments, the metal layer of the contact metal layer 40 contacts a doped layer of the semiconductor substrate 10 thereby forming a low resistance contact. In one embodiment, the metal layer of the contact metal layer 40 may be formed as a silicide by depositing a silicide source metal such as nickel, tungsten, cobalt, titanium, tantalum, and others over the back side 13 of the substrate 10. The substrate 10 may be heated so as to form a silicide layer after which excess silicide source metal may be removed. In some embodiments, the silicide formation may be performed at a different process step due to the limited temperature allowed by the carrier/glue system.

In one embodiment, the contact metal layer 40 comprises an aluminum layer contacting a doped silicon layer of the semiconductor substrate 10. In further embodiments, the contact metal layer 40 may comprise a metal silicide followed by an aluminum layer. In one embodiment, the contact metal layer 40 may comprise an AlSi layer, AlCu layer, or AlSiCu layer followed by an aluminum layer.

In various embodiments, the contact metal layer 40 may be deposited using any suitable deposition processes including evaporation, sputtering, chemical vapor deposition, and other plasma deposition processes. In one or more embodiments, the contact metal layer 40 has a thickness of 50 nm to about 1000 nm, and about 500 nm in one embodiment.

Referring again to FIG. 3, a diffusion barrier metal layer 50 is formed over the contact metal layer 40. In one exemplar embodiment, in one embodiment, a diffusion barrier metal layer 50 comprising essentially of pure titanium may be deposited over the contact metal layer 40. In various embodiments, the diffusion barrier metal layer 50 may be a diffusion barrier metal such as titanium nitride, titanium, tantalum, tantalum nitride, tungsten nitride, tungsten carbon nitride (WCN), ruthenium or other suitable conductive nitrides or oxides. In one embodiment, the diffusion barrier metal layer 50 is a layer of titanium or chromium.

In various embodiments, the diffusion barrier metal layer 50 may be deposited using any suitable deposition processes including evaporation, sputtering, chemical vapor deposition, and other plasma deposition processes. In one or more embodiments, the diffusion barrier metal layer 50 has a thickness of 200 nm to about 1000 nm, and about 500 nm in one embodiment. In one or more embodiments, the diffusion barrier metal layer 50 has the same thickness as the contact metal layer 40.

The diffusion barrier metal layer 50 prevents the copper from the molten solder during a soldering process from getting into the semiconductor substrate 10 as well as stops the aluminum from getting into the other layers of the solder stack.

An inert layer 60 is formed over the diffusion barrier metal layer 50. The inert layer 60 is intended to avoid producing any corrosive phases during subsequent formation. In one or more embodiments, the inert layer 60 is configured to not react with the selected liquid solder during a subsequent soldering process. For example, in various embodiments, the inert layer 60 comprises no corrosive substances. In one or more embodiments, the inert layer 60 comprises tungsten titanium. In particular, the amount of tungsten is greater than the amount of titanium in various embodiments. In one or more embodiments, the inert layer 60 comprises 10% titanium and 90% tungsten. In another embodiment, the inert layer 60 comprises 40% titanium and 60% tungsten. Advantageously, the titanium from the tungsten titanium does not diffuse out at the temperatures used for the soldering process and the concentration of titanium is lower, which helps to further restrict the out-diffusion of titanium.

In various embodiments, all the layers within the backside metallization stack including the inert layer 60 are formed using a DC magnetron sputtering. In various embodiments, the inert layer 60 is formed by a sputtering process, for example, from a common tungsten titanium target, so that titanium and tungsten are deposited together.

In one or more embodiments, the inert layer 60 may be formed as a multiple layer stack. For example, in one embodiment, a layer of WTi may be deposited in a nitrogen atmosphere so as to incorporate some titanium nitride and/or tungsten nitride followed by the deposition of WTi in an argon atmosphere.

In one or more embodiments, the inert layer 60 has a thickness of 100 nm to about 400 nm, and about 200 nm in one embodiment. In one or more embodiments, the inert layer 60 has a thickness that is about half the thickness of the diffusion barrier metal layer 50. In one or more embodiments, the inert layer 60 prevents the material from the diffusion barrier metal layer 50 from reacting with the subsequent layers and forming a layer with poor corrosion resistance.

A solder active metal layer 70 is formed over the inert layer 60. The solder active metal layer 70 is configured to react with other components, i.e., solder metal, and form a solder joint during a soldering process. For example, in one embodiment, the solder active metal layer 70 may form a eutectic phase with a solder metal. In one illustration, the solder active metal layer 70 comprises nickel vanadium. In one embodiment, the solder active metal layer 70 comprises 5-10% vanadium, for example, 7% vanadium in one embodiment. In another embodiment, the solder active metal layer 70 comprises substantially 100% nickel.

In various embodiments, the solder active metal layer 70 may be deposited using any suitable deposition processes including evaporation, sputtering such as magnetron sputtering, chemical vapor deposition, electroplating, electroless plating, stencil or screen printing, and other plasma deposition processes.

Referring again to FIG. 3, a capping layer 80 is formed over the solder active metal layer 70. The capping layer 80 is designed to protect the underlying stack of layers from environmental and other damage. In one or more embodiments, the capping layer 80 is a noble metal. In one example, the capping layer 80 is a layer of silver.

Figure 4:
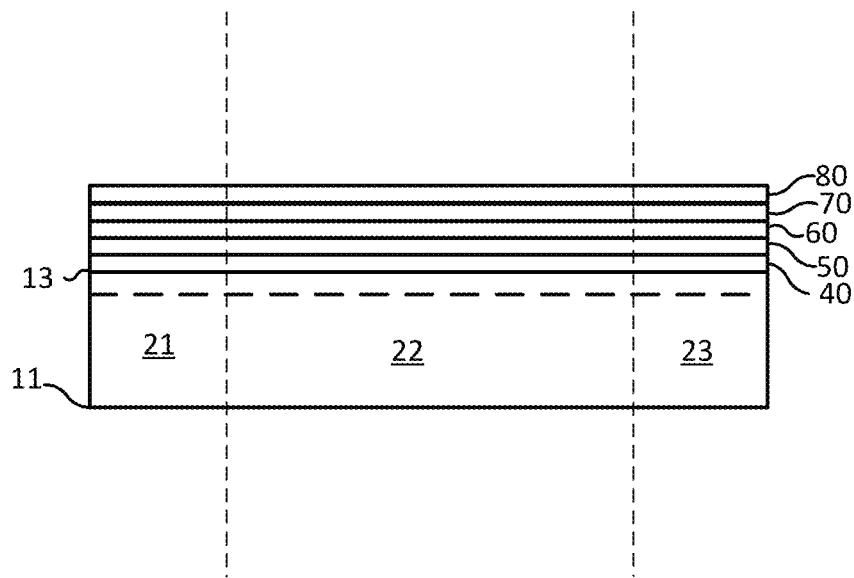
FIG. 4 illustrates a semiconductor device showing singulation of the substrate in accordance with embodiments of the present invention.

FIG. 4 illustrates a semiconductor device showing singulation of the substrate in accordance with embodiments of the present invention.

As illustrated in FIG. 4, after forming all the layers of the metal stack, the substrate 10 may be singulated to separate the first chip 21, the second chip 22, and the third chip 23.

Figure 5:
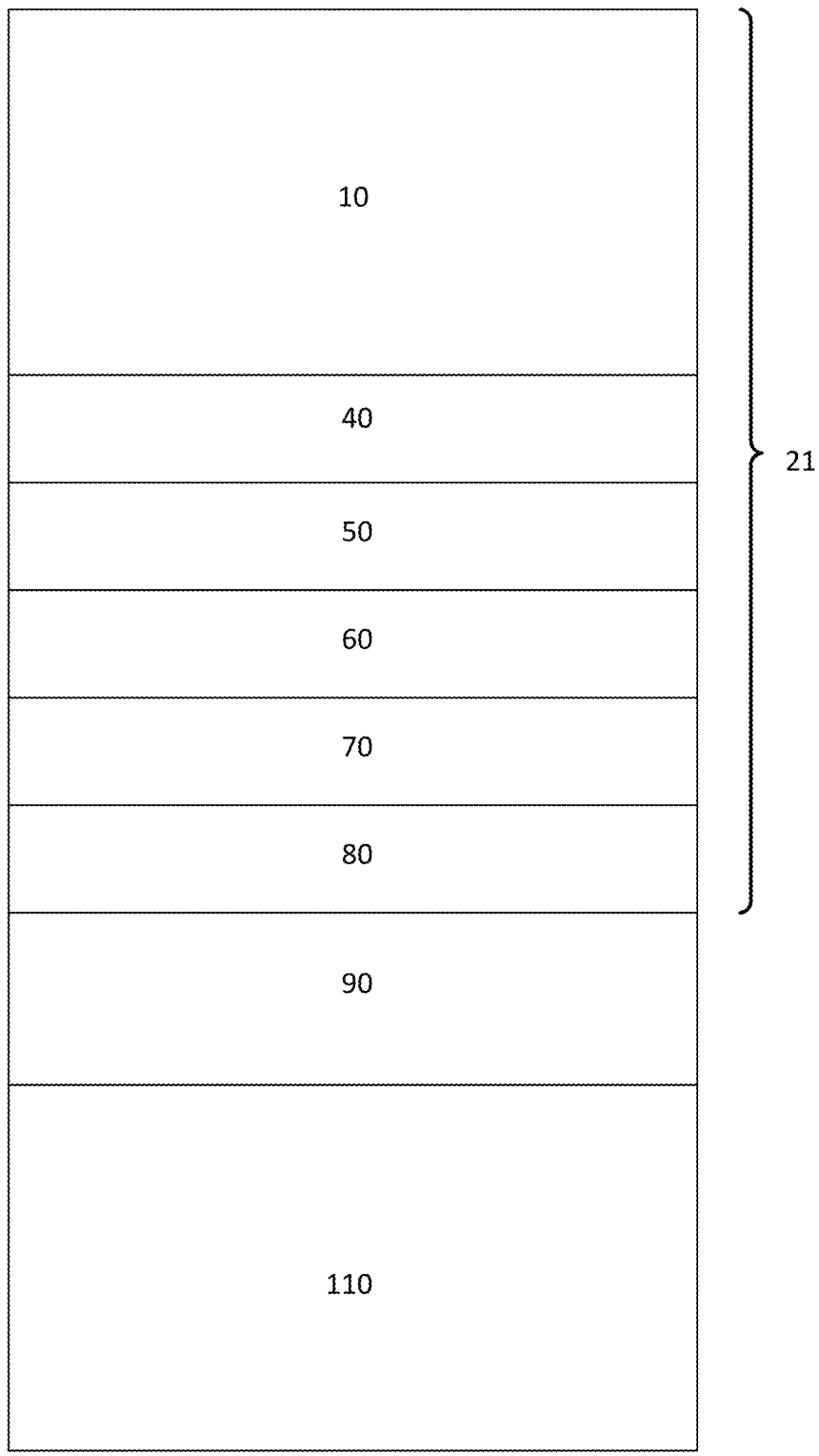
FIG. 5 illustrates a magnified view of a semiconductor chip attached to another substrate in accordance with embodiments of the present invention.

FIG. 5 illustrates an embodiment of the semiconductor chip attached to another substrate 110. In various embodiments, another substrate 110 is another chip or may be a die paddle of a lead frame or other types of package substrates such as metal (e.g., copper) plated ceramic board.

As illustrated in FIG. 5, another substrate 110 may include a layer of solder 90, which is used to attach the another substrate 110 with the solder stack of the first chip 21. The solder 90 may include a Sn alloy or a Sn layer as an example. When heated, the tin in the solder 90 mixes with the metals in the solder stack of the first chip 21 to form an adhesive bond.

In various embodiments, the solder 90 may comprise a lead free solder and may include copper, tin, zinc, manganese, bismuth, indium, antimony, and others. For example, in an alternative embodiment, the solder 90 may comprise copper, tin, silver, and manganese. In another embodiment, a lead solder may be used, for example, comprising lead and tin. Other examples for the solder 90 include SnPbAg, SnPb, PbAg, PbIn, and lead free materials such as SnBi, SnAgCu, SnTn, and SiZn. The solder 90 may be electroplated, although, in other embodiments, other processes such as electroless plating or deposition processes such as vapor deposition may also be used. In one or more embodiments, to minimize cost of the soldering process, the solder 90 may be introduced using screen printing of the solder paste, or using solder platelets from module packages, or from attaching of a solder wire onto the heated surface of a lead frame (or other discrete package).

Next a soldering process is performed. In various embodiments, during the soldering process, the whole system may be heated in a heated tunnel with a conveyor belt or in a soldering oven. Alternatively, the solder stack may be locally heated to melt the solder 90, and the capping layer 80. For example, a laser tool may be used to locally heat the solder 90 in one embodiment. In another embodiment, a heating tool may be used to locally heat the solder 90.

Figure 6:
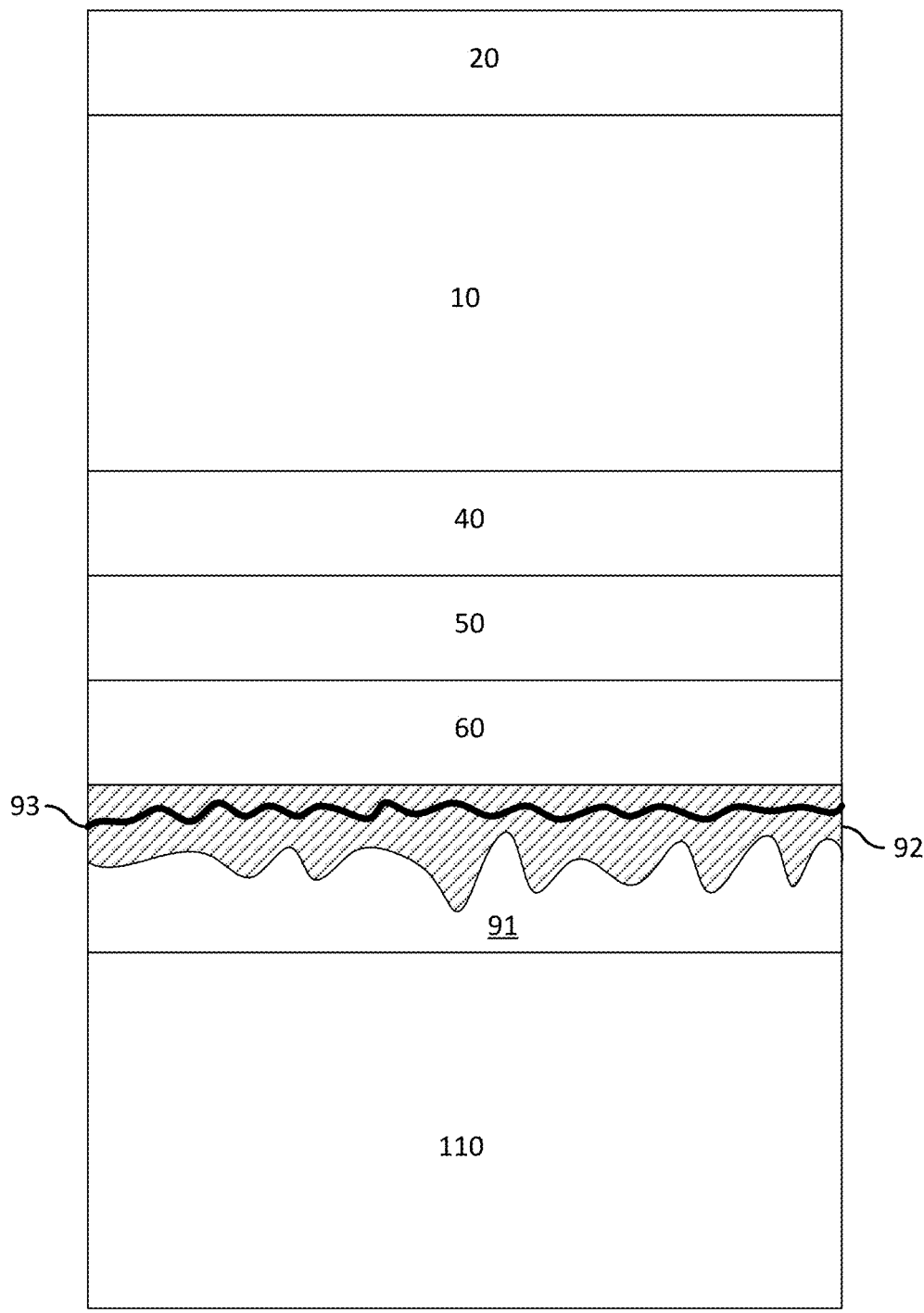
FIG. 6 illustrates an embodiment of the semiconductor chip after being attached to another substrate in a soldering process.
Figure 7:
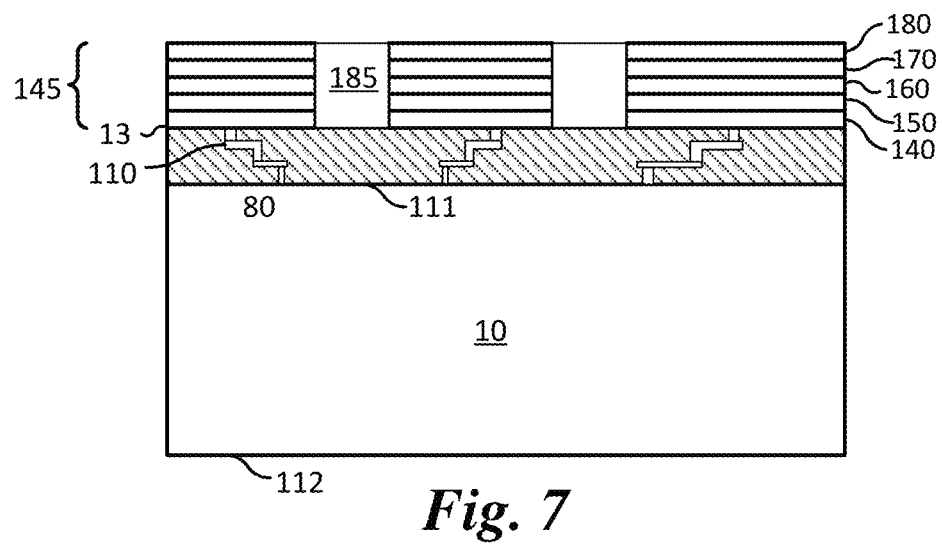
FIG. 7 illustrates an alternative embodiment in which the solder stack is formed over the front side of the wafer.

FIG. 6 illustrates an embodiment of the semiconductor chip after being attached to another substrate 110 after a soldering process. As next illustrated in FIG. 6, during the soldering process, the various metals mix with the metal from the underlying layers of the solder stack. The inert layer 60 remains stable and forms a protective layer preventing metals from diffusing through it to overlying layers and the substrate 10. Further, the inert layer 60 does not take part in the soldering reaction. In various embodiments, the inert layer 60 does not form any corrosive phases by reacting with the liquid solder during the soldering process. Accordingly, the soldering bond is produced by the reaction between the solder metal active layer 70, the capping layer 80, and the solder 90 (compare with FIG. 5). A contacting solder layer 92 is formed within the solder matrix 91. The solder matrix 91 also comprises one or more of a remaining layer 93 in some embodiments.

In one exemplary embodiment, the remaining layer 93 comprises tin-vanadium alloy layer, and the contacting solder layer 92 comprises an intermetallic comprising copper from the another substrate 110 and tin. For example, the contacting solder layer 92 comprises $Cu_6Sn_5$ and/or $Cu_3Sn$. The inert layer 60 is a tungsten titanium layer that improves the corrosion resistance of the solder stack by not reacting with solder active metals such as tin and vanadium. The diffusion barrier metal layer 50 comprises a titanium layer and prevents the copper from the another substrate 110 from diffusing into the substrate 10 and contact metal layer 40.

In various embodiments, the solder matrix 91 including the contacting solder layer 92 and the remaining layer 93 contain no titanium. In contrast, in conventional solder stacks during soldering, a tin rich layer is formed in the titanium layer and a tin-titanium-vanadium layer is formed at the interface with the intermetallic phase ($Cu_6Sn_5$). Such a conventional solder stack has reduced reliability because of the corrosive nature of the tin-titanium-vanadium layer. Advantageously, in various embodiments, this tin-titanium-vanadium layer is avoided because of the overlying inert layer 60, which may be a titanium-tungsten layer. Rather, only a tin vanadium layer is formed in various embodiments, which has much better corrosion resistance.

Further, in embodiments of the present invention, a relatively thin solder active metal layer 70 is sufficient, for example, between 100 nm to 400 nm. For example, a thick layer of nickel vanadium (e.g., thicker than 500 nm) when used as the solder active metal layer 70 results in significant built-in stress leading to chip bow. Further, in some embodiments, the soldering may be partial, for example, the solder active layer 70 may not be fully consumed and may be present.

FIG. 7 illustrates an alternative embodiment in which the solder stack is formed over the front side of the wafer.

Referring to FIG. 7, the substrate comprises a front side 111 and a back side 112. The front side 111 of the substrate 10 comprises the active devices and circuitry includes a solder stack disposed thereon. The front side metallization may include one or more metal layers formed over the substrate 10. Each of the metal levels may include a layer comprising metal lines and a layer comprising vias as an example.

The front side solder stack 145 comprising a front side contact layer 140, front side diffusion barrier layer 150, front side inert layer 160, front side solder active metal layer 170, and front side capping layer 180 are formed over the substrate 10 and front end metallization. The front side solder stack 145 may be part of the under bump metallization process in one embodiment. Accordingly, one or more contact pads are formed over the front side 111 of the substrate 10. Adjacent contact pads are separated by dielectric regions 185, which may comprise mold compound and other insulating materials in various embodiments.

The front side solder stack 145 is patterned in embodiments in which it is formed as a blanket layer. Adjacent pads may form the front side solder stack 145 and may be used to contact different regions of a single device or contact different devices on the substrate 10.

In various embodiments, the front side solder stack 145 may comprise similar materials as the back side solder stack described in FIGS. 1-6.

Figure 8A:
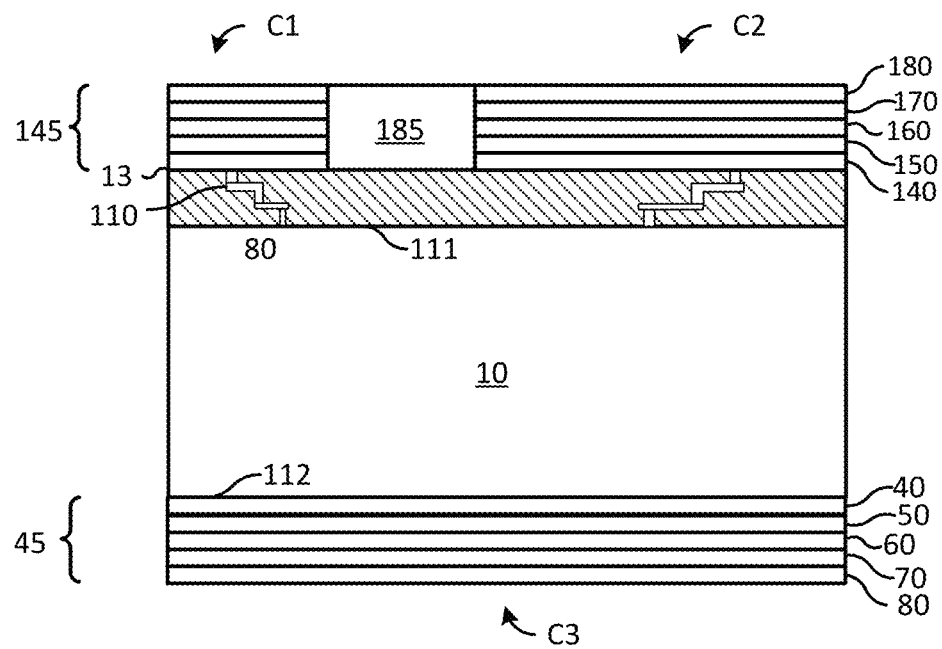
FIG. 8A illustrates a further embodiment comprising both front side solder stack and a back side solder stack formed according to embodiments of the present invention.

FIG. 8A illustrates a further embodiment comprising both front side solder stack and a back side solder stack formed according to embodiments of the present invention.

The front side solder stack 145 may be formed similar to FIG. 7 and the back side solder stack 45 may be formed as described in FIGS. 1-6. As an illustration, in one embodiment, a discrete component may comprise a first contact pad C1, a second contact pad C2, and a third contact pad C3 formed as described in various embodiments. The first contact pad C1 may be a gate pad while the second contact pad C2 and the third contact pad C3 may be a source pad and a drain pad (or vice versa).

Figure 8B:
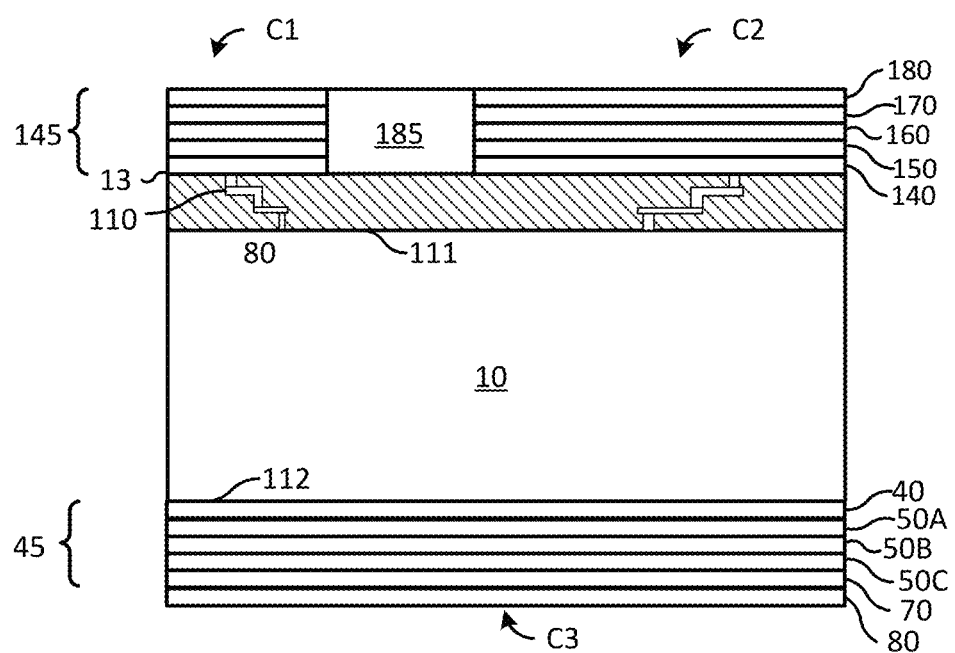
FIG. 8B illustrates a further embodiment comprising a front side solder stack and a back side solder stack in which the back side solder stack comprises more than two diffusion barrier layer according to embodiments of the present invention.

FIG. 8B illustrates a further embodiment comprising a front side solder stack and a back side solder stack in which the back side solder stack comprises more than two diffusion barrier layer according to embodiments of the present invention.

In various embodiments, more than two diffusion barrier layers may be used in the front side solder stack and the back side solder stack. These may be implemented in the structures illustrated in FIGS. 4-7. As an illustrated in FIG. 8B, three barrier layers are shown unlike prior embodiments with two barrier layers. For example, unlike FIG. 8A, which included two barriers (diffusion barrier metal layer 50 and inert layer 60), this embodiment includes three barrier layers. A first barrier layer 50A, a second barrier layer 60B, and a third barrier layer 60C are formed over the contact metal layer 40.

In one illustration, the first barrier layer 50A comprises a pure titanium layer (similar to the diffusion barrier metal layer 50 described in prior embodiments), the second barrier layer 60B comprises a titanium tungsten doped with nitrogen (similar to the first inert layer 60 described in prior embodiments), and the third barrier layer 60C comprises a titanium tungsten layer without nitrogen (similar to the first inert layer 60 described in prior embodiments).

In one embodiment, the first barrier layer 50A is a barrier to the diffusion of a first metal, and the second barrier layer 50B is a barrier to the diffusion of a different second metal. For example, a diffusivity of a first metal in the first barrier layer 50A is at least five times slower than a diffusivity of the first metal in the solder active metal layer 70. The diffusivity of the first metal in the first barrier layer 50A is slower than a diffusivity of the first metal in the second barrier layer 50B. The diffusivity of the second metal in the second barrier layer 50B is at least five times slower than a diffusivity of the second metal in the solder active metal layer 70. The diffusivity of the second metal in the second barrier layer 50B is slower than a diffusivity of the second metal in the first barrier layer 50A. Similarly, the diffusivity of a different third metal in the third barrier layer 50C is slower than a diffusivity of the third metal in the solder active metal layer 70. Examples of the first metal, second metal, and third metal include copper, aluminum, and solder metals such as silver, tin, nickel, and others.

Accordingly, a multi-layer solder stack is described in which each layer is tailored to block a particular metal.

FIGS. 9-13 illustrate a device during various stages of fabrication in accordance with embodiments of the present invention. The method described below may be used to fabricate the devices illustrated in FIGS. 7 and 8 as well.

Figure 9:
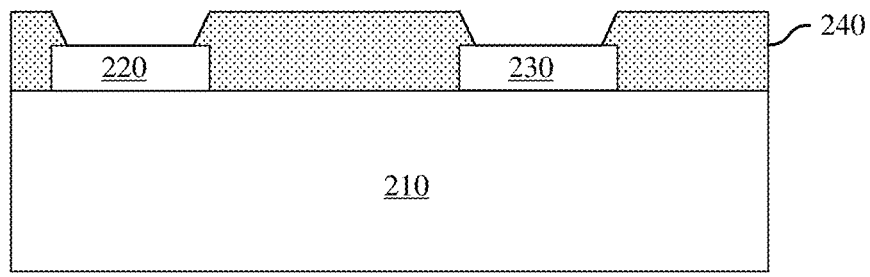
FIG. 9 illustrates a device during fabrication after the formation of front side contact pads in accordance with embodiments of the present invention.

FIG. 9 illustrates a device during fabrication after the formation of front side contact pads in accordance with embodiments of the present invention.

In one embodiment, FIG. 9 illustrates a semiconductor device after all fabrication processes. The fabrication processes end with the formation of the plurality of chip contact pads. For example, a first conductive pad 220 and a second conductive pad 230 are exposed between an insulating layer 240. The first conductive pad 220 and the second conductive pad 230 may comprise aluminum pads in one or more embodiments. In alternative embodiments, first conductive pad 220 and the second conductive pad 230 may comprise copper pads.

The insulating layer 240 may be a resin layer, a polyimide layer, a silicon oxide layer, a silicon nitride layer, and other suitable insulating material known to a person having ordinary skill in the art. As described in various embodiments, the substrate 210 may include a semiconductor substrate, an insulating substrate, and other types of carriers.

Figure 10:
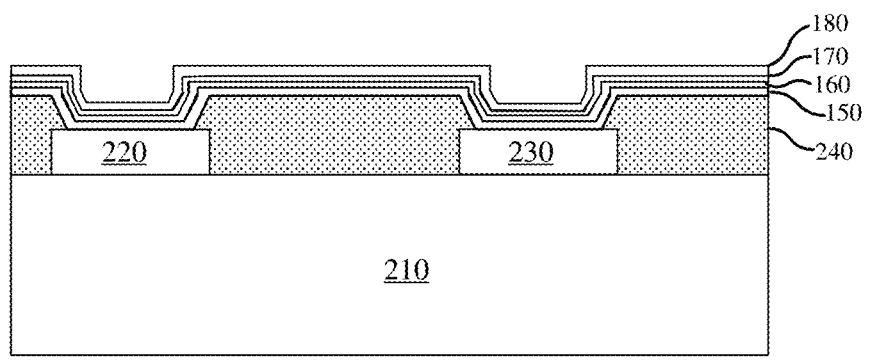
FIG. 10 illustrates a device during fabrication after the formation of solder stack over the front side contact pads in accordance with embodiments of the present invention.

FIG. 10 illustrates a device during fabrication after the formation of solder stack over the front side contact pads in accordance with embodiments of the present invention.

Referring to FIG. 10, a under bump metallization layer is formed over the substrate 210. In various embodiments, the under bump metallization layer is formed as a blanket layer. The under bump metallization layer may include one or more conductive layers. In one or more embodiments, the under bump metallization layer comprises a front side diffusion barrier layer 150, a front side inert layer 160, a front side solder active metal layer 170, and a front side capping layer 180. In various embodiments, the front side diffusion barrier layer 150 as well as overlying layers may be deposited using a sputtering process. In alternative embodiments, other deposition processes including chemical vapor deposition, physical vapor deposition, atomic layer deposition, evaporation, may be used. The front side diffusion barrier layer 150 is designed to prevent solder atoms from diffusing into the substrate 210. The front side diffusion barrier layer 150 may comprise titanium in one embodiment. For example, in one embodiment, a front side diffusion barrier layer 150 comprising essentially of pure titanium may be deposited over the substrate 210.

Next, the front side inert layer 160 is deposited over the front side diffusion barrier layer 150. The front side inert layer 160 may comprise titanium and tungsten in one embodiment. In various embodiments, the thickness of the front side inert layer 160 is about the same as the front side diffusion barrier layer 150. In other embodiments, the thickness of the front side inert layer 160 is about half the thickness of the front side diffusion barrier layer 150.

The front side solder active metal layer 170 is then deposited over the front side diffusion barrier layer 150. The front side solder active metal layer 170 is selected to prevent the subsequent solder metal from diffusing into the first conductive pad 220 and the second conductive pad 230. The front side solder active metal layer 170 may be deposited using a sputtering process in one embodiment. In alternative embodiments, other deposition processes including chemical vapor deposition, physical vapor deposition, atomic layer deposition, evaporation, may be used. In various embodiments, the front side solder active metal layer 170 may comprise nickel, nickel vanadium, chromium, copper, and other suitable materials.

A front side capping layer 180 is deposited over the front side solder active metal layer 170. The front side capping layer 180 may comprise a single metal layer or a plurality of different metal layers in various embodiments. In one embodiment, the front side capping layer 180 comprises silver. In various embodiments, the front side capping layer 180 may comprise a lead free solder and may include copper, tin, zinc, manganese, bismuth, indium, antimony, and others. For example, in an alternative embodiment, the front side capping layer 180 may comprise copper, tin, silver, and manganese. In another embodiment, a lead solder may be used, for example, comprising lead and tin. Other examples for the front side capping layer 180 include SnPbAg, SnPb, PbAg, PbIn, and lead free materials such as SnBi, SnAgCu, SnTn, and SiZn. The front side capping layer 180 may be electroplated, although, in other embodiments, other processes such as electroless plating or deposition processes such as vapor deposition may also be used. In one embodiment, the front side capping layer 180 may be sputter deposited.

Figure 11:
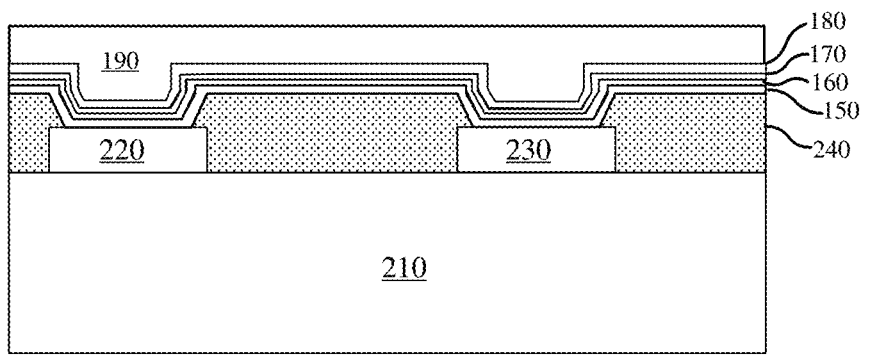
FIG. 11 illustrates a device during fabrication after the formation of a resist over the solder stack in accordance with embodiments of the present invention.

FIG. 11 illustrates a device during fabrication after the formation of a resist over the solder stack in accordance with embodiments of the present invention.

Referring to FIG. 11, a resist 190 is deposited over the substrate 210. The resist 190 may be a positive or a negative photo resist in various embodiments.

Figure 12:
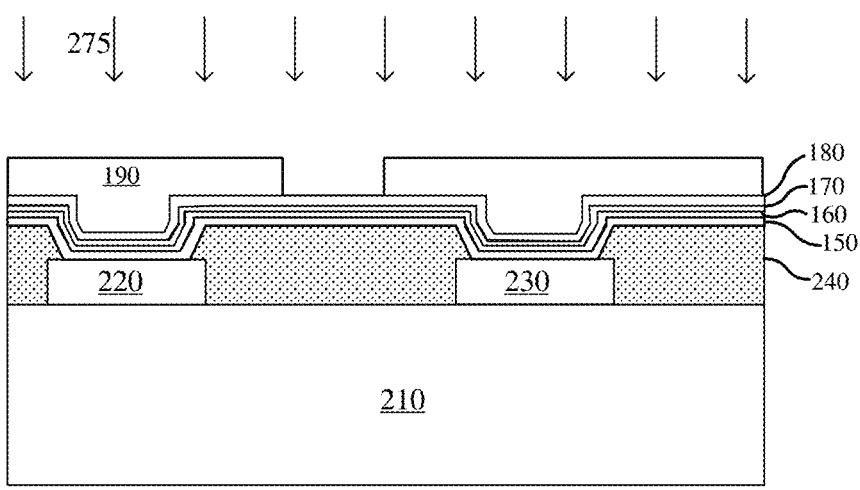
FIG. 12 illustrates a device during fabrication after patterning the solder stack in accordance with embodiments of the present invention.

FIG. 12 illustrates a device during fabrication after patterning the solder stack in accordance with embodiments of the present invention.

The resist 190 is patterned using conventional lithography techniques as illustrated in FIG. 12. After the patterning, the area between the first conductive pad 220 and the second conductive pad 230 is opened whereas the resist 190 protects the area directly over the first conductive pad 220 and the second conductive pad 230.

A wet etching process 275 is used to remove the solder stack exposed by the patterning of the resist 290. The wet etching process may include etching with one or more of dilute hydrofluoric, nitric, phosphoric, acetic acids, hydrogen peroxide, ammonium hydroxide, and ammonium-peroxide, and others to etch a solder stack comprising silver, as an example.

In various embodiments, the etching processes may be performed using a single tool, for example, within a same chamber or within multiple chambers or may be processed within multiple tools. In one or more embodiments, the etching processes may be an isotropic process or an anisotropic process. In one embodiment, the exposed front side capping layer 180, front side solder active metal layer 170, front side inert layer 160, front side diffusion barrier layer 150 may be removed using a plasma process such as a reactive ion etching.

Figure 13:
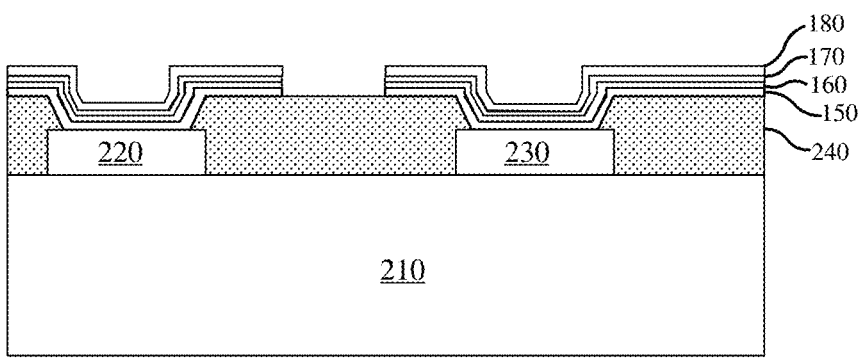
FIG. 13 illustrates a device during fabrication after patterning the solder stack and removing the remaining resist in accordance with embodiments of the present invention.

FIG. 13 illustrates a device during fabrication after patterning the solder stack and removing the remaining resist in accordance with embodiments of the present invention.

Any remaining resist 190 may be removed leaving a plurality of contact pads as illustrated in FIG. 13. Accordingly, two or more contact pads may be formed over the front side of the substrate 210.

Embodiments of the present invention may include devices as well as processes and apparatus used to fabricate the devices. One general aspect includes a semiconductor device including a contact metal layer disposed over a semiconductor surface of a substrate, a diffusion barrier layer disposed over the contact metal layer, an inert layer disposed over the diffusion barrier layer, and a solder layer disposed over inert layer.

Implementations may include one or more of the following features. The diffusion barrier layer may include titanium or chromium, the inert layer may include tungsten, titanium nitride, tantalum, tantalum nitride, and chromium, and the solder layer may include tin and silver. The diffusion barrier layer may include titanium or chromium, the inert layer may include a tungsten titanium alloy, and the solder layer may include tin and silver. The device further includes an intermetallic layer disposed between the inert layer and the solder layer. The intermetallic layer may include a copper tin intermetallic. The device may further include a tin vanadium layer disposed in the intermetallic layer. The contact metal layer may include an aluminum layer, the diffusion barrier layer may include a titanium or chromium layer, the inert layer may include a titanium-tungsten, titanium nitride, tantalum, tantalum nitride, or tungsten layer, the solder active layer may include a nickel or nickel vanadium layer, the capping layer may include silver. The method further includes soldering by exposing the capping layer to a solder material to form a solder layer over the inert layer. The method where the semiconductor surface includes active circuitry and devices. The method where the semiconductor surface is opposite another surface of the substrate, and the another surface includes active circuitry and devices. The method where the diffusion barrier layer includes titanium or chromium. The method where the inert layer includes tungsten titanium alloy. The method where the inert layer includes tungsten, titanium nitride, tantalum, tantalum nitride, and chromium, where the solder active layer includes nickel or nickel vanadium, and where the capping layer includes silver. The method where the semiconductor surface is opposite another semiconductor surface of the substrate, the another semiconductor surface includes active circuitry and devices, and further includes providing a contact pad over the another semiconductor surface of the substrate, forming a front side diffusion barrier layer over the contact pad, forming a front side inert layer over the front side diffusion barrier layer, forming a front side solder active layer over the front side inert layer, and forming a front side capping layer over the front side solder active layer. The method where the first barrier layer is the diffusion barrier layer for copper and includes titanium or chromium, and the second barrier layer includes tungsten, titanium nitride, tantalum, tantalum nitride, or chromium. The method where the first barrier layer is a barrier to the diffusion of a first metal, and where the second barrier layer is a barrier to the diffusion of a second metal. The method where a diffusivity of a first metal in the first barrier layer is slower than a diffusivity of the first metal in the solder active layer. The method where the diffusivity of the first metal in the first barrier layer is slower than a diffusivity of the first metal in the second barrier layer. The method where a diffusivity of a second metal in the second barrier layer is slower than a diffusivity of the second metal in the solder active layer. The method where the diffusivity of the second metal in the second barrier layer is slower than a diffusivity of the second metal in the first barrier layer. The method further includes forming a third barrier layer before forming the solder active layer. The method where a diffusivity of a first metal in the first barrier layer is slower than a diffusivity of the first metal in the solder active layer, where a diffusivity of a second metal in the second barrier layer is slower than a diffusivity of the second metal in the solder active layer, and where a diffusivity of a third metal in the third barrier layer is slower than a diffusivity of the third metal in the solder active layer. The method further includes soldering by exposing the capping layer to a solder material to form a solder layer over the inert layer. The method where the semiconductor surface includes active circuitry and devices. The method where the semiconductor surface is opposite another surface of the substrate, the another surface includes active circuitry and devices. The method where the thickness of the titanium or chromium layer is about two times the thickness of the titanium-tungsten layer.

One general aspect includes a semiconductor device including a contact metal layer disposed over a semiconductor surface of a substrate, a diffusion barrier layer disposed over the contact metal layer, an inert layer disposed over the diffusion barrier layer, a solder active layer over the inert layer, and a capping layer over the solder active layer.

Implementations may include one or more of the following features. The device where the contact metal layer includes an aluminum layer, where the diffusion barrier layer includes a titanium or chromium layer, where the inert layer includes a titanium-tungsten, titanium nitride, tantalum, tantalum nitride, or tungsten layer, where the solder active layer includes a nickel or nickel vanadium layer, where the capping layer includes silver. The device where the solder active layer includes nickel or nickel vanadium, and where the capping layer includes silver. The method further includes soldering by exposing the capping layer to a solder material to form a solder layer over the inert layer. The method where the semiconductor surface includes active circuitry and devices. The method where the semiconductor surface is opposite another surface of the substrate, the another surface includes active circuitry and devices. The method where the diffusion barrier layer includes titanium or chromium. The method where the inert layer includes tungsten titanium alloy. The method where the inert layer includes tungsten, titanium nitride, tantalum, tantalum nitride, and chromium, where the solder active layer includes nickel or nickel vanadium, and where the capping layer includes silver. The method where the semiconductor surface is opposite another semiconductor surface of the substrate, the another semiconductor surface including active circuitry and devices, and further includes providing a contact pad over the another semiconductor surface of the substrate; forming a front side diffusion barrier layer over the contact pad; forming a front side inert layer over the front side diffusion barrier layer; forming a front side solder active layer over the front side inert layer; and forming a front side capping layer over the front side solder active layer. The method where the first barrier layer is the diffusion barrier layer for copper and includes titanium or chromium, and the second barrier layer includes tungsten, titanium nitride, tantalum, tantalum nitride, or chromium. The method where the first barrier layer is a barrier to the diffusion of a first metal, and where the second barrier layer is a barrier to the diffusion of a second metal. The method where a diffusivity of a first metal in the first barrier layer is slower than a diffusivity of the first metal in the solder active layer. The method where the diffusivity of the first metal in the first barrier layer is slower than a diffusivity of the first metal in the second barrier layer. The method where a diffusivity of a second metal in the second barrier layer is slower than a diffusivity of the second metal in the solder active layer. The method where the diffusivity of the second metal in the second barrier layer is slower than a diffusivity of the second metal in the first barrier layer. The method further including forming a third barrier layer before forming the solder active layer. The method where a diffusivity of a first metal in the first barrier layer is slower than a diffusivity of the first metal in the solder active layer, where a diffusivity of a second metal in the second barrier layer is slower than a diffusivity of the second metal in the solder active layer, and where a diffusivity of a third metal in the third barrier layer is slower than a diffusivity of the third metal in the solder active layer. The method further including soldering by exposing the capping layer to a solder material to form a solder layer over the inert layer. The method where the semiconductor surface includes active circuitry and devices. The method where the semiconductor surface is opposite another surface of the substrate, the another surface includes active circuitry and devices. The method where the thickness of the titanium or chromium layer is about two times the thickness of the titanium-tungsten layer.

One general aspect includes a method of forming a semiconductor device, the method includes providing a contact metal layer over a semiconductor surface of a substrate, forming a diffusion barrier layer over the contact metal layer, forming an inert layer over the diffusion barrier layer, forming a solder active layer over the inert layer, and forming a capping layer over the solder active layer.

Implementations may include one or more of the following features. The method further including soldering by exposing the capping layer to a solder material to form a solder layer over the inert layer. The method where the semiconductor surface includes active circuitry and devices. The method where the semiconductor surface is opposite another surface of the substrate, the another surface includes active circuitry and devices. The method where the diffusion barrier layer includes titanium or chromium. The method where the inert layer includes tungsten titanium alloy. The method where the inert layer includes tungsten, titanium nitride, tantalum, tantalum nitride, and chromium, where the solder active layer includes nickel or nickel vanadium, and where the capping layer includes silver. The method where the semiconductor surface is opposite another semiconductor surface of the substrate, the another semiconductor surface including active circuitry and devices, and further including providing a contact pad over the another semiconductor surface of the substrate, forming a front side diffusion barrier layer over the contact pad, forming a front side inert layer over the front side diffusion barrier layer, forming a front side solder active layer over the front side inert layer, and forming a front side capping layer over the front side solder active layer. The method where the first barrier layer is the diffusion barrier layer for copper and includes titanium or chromium, and the second barrier layer includes tungsten, titanium nitride, tantalum, tantalum nitride, or chromium. The method where the first barrier layer is a barrier to the diffusion of a first metal, and where the second barrier layer is a barrier to the diffusion of a second metal. The method where a diffusivity of a first metal in the first barrier layer is slower than a diffusivity of the first metal in the solder active layer. The method where the diffusivity of the first metal in the first barrier layer is slower than a diffusivity of the first metal in the second barrier layer. The method where a diffusivity of a second metal in the second barrier layer is slower than a diffusivity of the second metal in the solder active layer. The method where the diffusivity of the second metal in the second barrier layer is slower than a diffusivity of the second metal in the first barrier layer. The method further including forming a third barrier layer before forming the solder active layer. The method where a diffusivity of a first metal in the first barrier layer is slower than a diffusivity of the first metal in the solder active layer, where a diffusivity of a second metal in the second barrier layer is slower than a diffusivity of the second metal in the solder active layer, and where a diffusivity of a third metal in the third barrier layer is slower than a diffusivity of the third metal in the solder active layer. The method further including soldering by exposing the capping layer to a solder material to form a solder layer over the inert layer. The method where the semiconductor surface includes active circuitry and devices. The method where the semiconductor surface is opposite another surface of the substrate, the another surface including active circuitry and devices. The method where the thickness of the titanium or chromium layer is about two times the thickness of the titanium-tungsten layer.

One general aspect includes a method of forming a semiconductor device, the method including providing a contact metal layer over a semiconductor surface of a substrate, forming a first barrier layer contacting the contact pad layer, forming a second barrier layer over the first barrier layer, and forming a solder active layer over the second barrier layer.

Implementations may include one or more of the following features. The method where the first barrier layer is the diffusion barrier layer for copper and includes titanium or chromium, and the second barrier layer includes tungsten, titanium nitride, tantalum, tantalum nitride, or chromium. The method where the first barrier layer is a barrier to the diffusion of a first metal, and where the second barrier layer is a barrier to the diffusion of a second metal. The method where a diffusivity of a first metal in the first barrier layer is slower than a diffusivity of the first metal in the solder active layer. The method where the diffusivity of the first metal in the first barrier layer is slower than a diffusivity of the first metal in the second barrier layer. The method where a diffusivity of a second metal in the second barrier layer is slower than a diffusivity of the second metal in the solder active layer. The method where the diffusivity of the second metal in the second barrier layer is slower than a diffusivity of the second metal in the first barrier layer. The method further including forming a third barrier layer before forming the solder active layer. The method where a diffusivity of a first metal in the first barrier layer is slower than a diffusivity of the first metal in the solder active layer, where a diffusivity of a second metal in the second barrier layer is slower than a diffusivity of the second metal in the solder active layer, and where a diffusivity of a third metal in the third barrier layer is slower than a diffusivity of the third metal in the solder active layer. The method further including soldering by exposing the capping layer to a solder material to form a solder layer over the inert layer. The method where the semiconductor surface includes active circuitry and devices. The method where the semiconductor surface is opposite another surface of the substrate, the another surface including active circuitry and devices. The method where the thickness of the titanium or chromium layer is about two times the thickness of the titanium-tungsten layer.

One general aspect includes a method of forming a semiconductor device, the method including providing an aluminum layer over a semiconductor surface of a substrate, forming a titanium or chromium layer contacting the aluminum layer, forming a titanium-tungsten, titanium nitride, tantalum, tantalum nitride, or tungsten layer over the titanium or chromium layer, forming a nickel or nickel vanadium layer over the titanium-tungsten, titanium nitride, tantalum, tantalum nitride, or tungsten layer, and forming a capping layer over the nickel or nickel vanadium layer.

Implementations may include one or more of the following features. The method further includes soldering by exposing the capping layer to a solder material to form a solder layer over the inert layer. The method where the semiconductor surface includes active circuitry and devices. The method where the semiconductor surface is opposite another surface of the substrate, the another surface includes active circuitry and devices. The method where the thickness of the titanium or chromium layer is about two times the thickness of the titanium-tungsten layer.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-13 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a contact metal layer disposed over a semiconductor surface of a substrate;
   a diffusion barrier layer disposed over the contact metal layer;
   an inert layer disposed over the diffusion barrier layer; and
   a solder layer disposed over the inert layer, and
   another substrate disposed over the solder layer, wherein the solder layer comprises an intermetallic layer comprising a metal from the another substrate.

2. The semiconductor device of claim 1, wherein the diffusion barrier layer comprises titanium or chromium, wherein the inert layer comprises tungsten, titanium nitride, tantalum, tantalum nitride, and chromium, and wherein the solder layer comprises tin and silver.

3. The semiconductor device of claim 1, wherein the diffusion barrier layer comprises titanium or chromium, wherein the inert layer comprises a tungsten titanium alloy, and wherein the solder layer comprises tin and silver.

4. The semiconductor device of claim 1, wherein the intermetallic layer comprises a copper tin intermetallic.

5. The semiconductor device of claim 4, further comprising a tin vanadium layer disposed in the intermetallic layer.

6. The semiconductor device of claim 1, wherein the metal from the another substrate comprises copper.

7. A semiconductor device comprising:
   a contact metal layer disposed over a semiconductor surface of a substrate;
   a diffusion barrier layer disposed over the contact metal layer;
   an inert layer disposed over the diffusion barrier layer;
   a solder active layer over the inert layer; and
   a capping layer over the solder active layer,
   wherein the contact metal layer, the diffusion barrier layer, the inert layer, the solder active layer, and the capping layer form a solder metallization stack and wherein each layer in the solder metallization stack is coterminous with the semiconductor surface of the substrate.

8. The semiconductor device of claim 7, wherein the contact metal layer comprises an aluminum layer, wherein the diffusion barrier layer comprises a titanium or chromium layer, wherein the inert layer comprises a titanium-tungsten, titanium nitride, tantalum, tantalum nitride, or tungsten layer, wherein the solder active layer comprises a nickel or nickel vanadium layer, wherein the capping layer comprises silver.

9. The semiconductor device of claim 7, wherein the solder active layer comprises nickel or nickel vanadium, and wherein the capping layer comprises silver.

10. A semiconductor device comprising:
a substrate comprising a front side and a back side, the front side of the substrate comprising front side metallization in communication with a plurality of active devices; and
a front side solder stack disposed over the front side of the substrate comprising a front side contact layer in communication with the front side metallization, a front side diffusion barrier layer, a front side inert layer, a front side solder active metal layer, and a front side capping layer,
wherein the front side contact layer, the front side diffusion barrier layer, the front side inert layer, the front side solder active metal layer, and the front side capping layer are coterminous with the front side of the substrate.

11. The semiconductor device of claim 10, wherein the front side solder stack comprises a plurality of contact pads, wherein adjacent contact pads are separated by dielectric regions.

12. The semiconductor device of claim 10, wherein the front side inert layer comprises titanium.

13. The semiconductor device of claim 10, wherein the front side solder active metal layer comprises nickel, nickel vanadium, chromium, or copper.

14. The semiconductor device of claim 10, wherein the front side capping layer comprises copper, tin, zinc, manganese, bismuth, indium, or antimony.

15. The semiconductor device of claim 10, further comprising a back side solder stack disposed over a back side of the substrate.

16. The semiconductor device of claim 15, wherein the back side solder stack comprises a back side contact metal layer, a back side diffusion barrier layer, a back side inert layer, a back side solder active metal layer, and a back side capping layer.

17. The semiconductor device of claim 16, wherein the back side diffusion barrier layer comprises a plurality of barrier layers.

18. The semiconductor device of claim 17, wherein a first diffusion barrier layer is a barrier to a diffusion of a first metal, and a second diffusion barrier layer is a barrier to a diffusion of a second metal different from the first metal.

19. The semiconductor device of claim 16, wherein the back side diffusion barrier layer comprises first, second, and third barrier layers.

20. The semiconductor device of claim 19, wherein the first barrier layer comprises a titanium layer, the second barrier layer comprises a titanium tungsten layer doped with nitrogen, and the third barrier layer comprises a titanium tungsten layer without nitrogen doping.

* * * * *